United States Patent
Henning

(10) Patent No.: US 10,919,573 B2
(45) Date of Patent: Feb. 16, 2021

(54) SENSOR FOR A MOTOR VEHICLE

(71) Applicant: HELLA GmbH & Co. KGaA, Lippstadt (DE)

(72) Inventor: Irle Henning, Lippstadt (DE)

(73) Assignee: Hella GmH & Co. KGaA, Lippstadt (DE)

( * ) Notice: Subject to any disclaimer, the term of this patent is extended or adjusted under 35 U.S.C. 154(b) by 375 days.

(21) Appl. No.: 15/991,511

(22) Filed: May 29, 2018

(65) Prior Publication Data

US 2018/0339731 A1    Nov. 29, 2018

(30) Foreign Application Priority Data

May 26, 2017 (DE) .................... 10 2017 111 529

(51) Int. Cl.
*B62D 15/02* (2006.01)
*G01R 33/09* (2006.01)
*B60K 23/02* (2006.01)
*G01D 5/14* (2006.01)

(52) U.S. Cl.
CPC .......... *B62D 15/021* (2013.01); *B60K 23/02* (2013.01); *G01R 33/098* (2013.01); *B60Y 2400/30* (2013.01); *G01D 5/145* (2013.01)

(58) Field of Classification Search
None
See application file for complete search history.

(56) References Cited

U.S. PATENT DOCUMENTS

| | | | |
|---|---|---|---|
| 6,314,355 B1 | 11/2001 | Mizuta et al. | |
| 2007/0195990 A1* | 8/2007 | Levy | G06K 9/2063 382/100 |
| 2010/0057299 A1 | 3/2010 | Burgdorf et al. | |
| 2010/0277224 A1* | 11/2010 | Jockel | G01P 21/02 327/530 |
| 2013/0066587 A1* | 3/2013 | Kalathil | G01D 5/145 702/150 |
| 2015/0224957 A1* | 8/2015 | Faughn | G02B 5/12 297/468 |
| 2015/0360643 A1* | 12/2015 | Cech | B60R 21/01546 297/217.3 |

FOREIGN PATENT DOCUMENTS

| | | |
|---|---|---|
| DE | 10033536 A1 | 2/2001 |
| DE | 10 2006 014 700 A1 | 9/2007 |
| DE | 10 2008 047 109 A1 | 5/2009 |

* cited by examiner

*Primary Examiner* — Paresh Patel
(74) *Attorney, Agent, or Firm* — Muncy, Geissler, Olds & Lowe, P.C.

(57) ABSTRACT

A sensor for a motor vehicle having an evaluation unit which is connected to an output of the sensor. The sensor should be able to activate at least one control unit and/or a sensor at low power consumption without significant delay. This is achieved by connecting a switching signal unit to the output of the sensor in parallel with the evaluation unit.

16 Claims, 1 Drawing Sheet

SENSOR FOR A MOTOR VEHICLE

This nonprovisional application claims priority under 35 U.S.C. § 119(a) to German Patent Application No. 10 2017 111 529.3, which was filed in Germany on May 26, 2017, and which is herein incorporated by reference.

BACKGROUND OF THE INVENTION

Field of the Invention

The present invention relates to a sensor for a motor vehicle having an evaluation unit which is connected to an output of the sensor.

Description of the Background Art

Sensors are known in the conventional art and are used in motor vehicles for different purposes and in a variety of configurations. The sensors, e.g., determine distances, angles or positions. The sensors operate, e.g., inductively, capacitively, magnetically, optically, potentiometrically with radar or with ultrasound. In some cases they form an interface between man and machine. In cases considered critical for safety, the sensors are redundant or at least multi-channel.

The sensors are connected to control units via the evaluation units, which feed the switching signals and/or interfaces.

In certain sensors and/or control units, it is desirable that they are active before the "ignition" of the vehicle is turned on. This is possible if these sensors and/or control units are permanently supplied with voltage. Because this would consume too much power and thus would discharge a motor vehicle battery (car battery) too quickly, the permanent voltage supply is not feasible.

To avoid the excessively rapid discharge, sensors with a switch are known, which are used to activate ECUs. The switch is designed, for example, as a Hall sensor. Along with a corresponding evaluation unit, in continuous operation this has a relatively high power requirement, which is why the switch is timed clocked with only a short duty cycle. Therefore, reaction times of the switch are relatively long and thus possibly do not activate the ECUs in a timely manner.

From US 2013/0066587 A1, a position sensor is known in which a magnetic field sensor comprises a sensor with tunnel magnetoresistance (TMR). The use of the position sensor with a switch to activate, for example, control units is not described.

SUMMARY OF THE INVENTION

It is therefore an object of the present invention to provide a sensor that can activate at least one control unit and/or a sensor at low power consumption without delay.

In an exemplary embodiment, a switching signal unit is connected to the output of the sensor in parallel with the evaluation unit. As a result, the switching signal unit can be controlled directly by the sensor, without the evaluation unit being turned on. Only the sensor and the switching signal unit are permanently supplied with voltage (via the terminal) and thus ready for use. In this way, very little power (less than 10 microamps) is consumed, so that a battery of the motor vehicle is only slightly, and thus purely safely, discharged. Since the sensor and the switching signal unit are constantly ready for use, a change in the sensor is registered immediately without time delay and the switching signal unit is able to activate directly connected units such as control units and other sensors. Thus, the necessary data and functions for electronically managing the motor vehicle are immediately available, which also increases the ease of use. Incorrect operation of the motor vehicle by a driver can be avoided by the early intervention of the control functions.

In an embodiment, the sensor can comprise a Wheatstone bridge. The latter is simple in design.

In an embodiment, tunnel magnetoresistive elements are connected in the Wheatstone bridge. These ensure low power consumption.

In an embodiment, the switching signal unit can be permanently connected to a voltage. This ensures a very fast switching response time.

In an embodiment, the sensor is a position sensor. Hereby, the desired effects of the invention can be realized most meaningfully.

In an embodiment, the sensor can be assigned to a clutch or brake pedal. In many cases, one of these pedals is operated by a driver before turning on the "ignition", so that the necessary functions are available at an early stage.

Also, the arrangement can be used to solve the multi-turn problem in power steering or to detect the twists of a seat belt. In these cases, the claimed arrangement can be used for a position sensor which is intended to detect several twists (>360°) in order to execute a counter function when the ignition is switched off (lap counter). After the ignition is turned on, the angle value is calculated from "lap counter *360°+sensor value of the 360° sensor". In this case, the lap counter does not have to count complete 360° segments, but can also be implemented in such a way that only partial angles of 360°/n (n=a natural number) are counted.

Like with the power steering, the multi-turn principle can be used in the same manner for detecting the twists and thus the wound or unwound length of a seat belt. This detection can be used as a comfort feature and for improved safety in a traffic accident (crash).

In an embodiment, the switching signal unit is integrated in a control unit. This simplifies the overall structure of the sensor and leads to corresponding reductions in cost.

In an embodiment, a switch of the switching signal unit has a transistor. Semiconductor devices are inexpensive and require little space.

In an embodiment, a switch of the switching signal unit has a MOSFET (metal-oxide-semiconductor field-effect transistor). These are generally well known, inexpensive to produce and consume very little power. Alternatively, a bipolar transistor is suitable.

In an embodiment, the sensor is energy-efficient. This is achieved, e.g., by using energy efficient elements in the Wheatstone bridge, in addition to a power saving evaluation circuit by means of an ASIC (application specific integrated circuit), suitable operational amplifier circuits. Preferably, the Wheatstone bridge consists of TMR (tunnel magneto resistive) elements.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
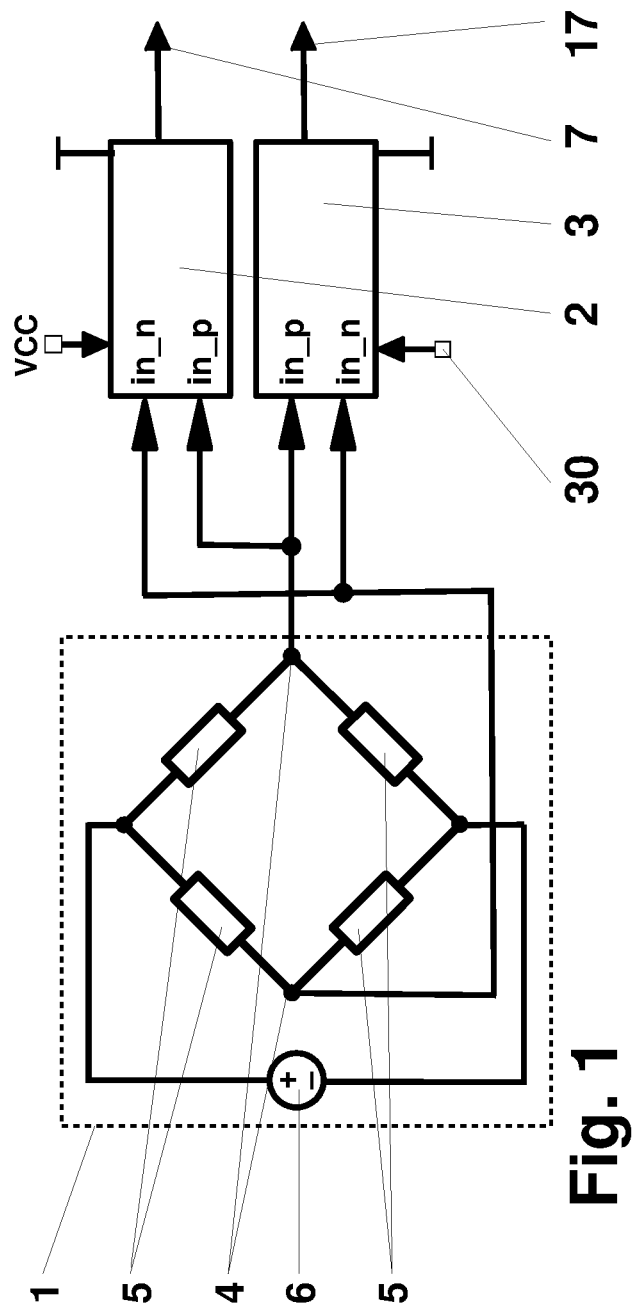
FIG. 1 is a circuit diagram of a sensor.

As can be seen from FIG. 1, a sensor comprises, e.g., a position sensor, a Wheatstone bridge 1, at the output 4 of which an evaluation unit 2 and a switching signal unit 3 are connected in parallel. The sensor is arranged in a motor vehicle and assigned, for example, to a clutch or brake pedal.

The Wheatstone bridge 1 comprises, as usual, four first resistors 5, which are interconnected to form a closed square. In a first diagonal of the Wheatstone bridge 1, a voltage source 6 is connected and in a second diagonal, the output 4 is connected, which outputs signals in the form of an output voltage (in_n and in_p).

The voltage source 6 is permanently, that is, independent of an "ignition" switching position, connected to a power supply of the motor vehicle (terminal 30). In order to reduce the power requirements of the assembly even further, it is further possible to clock the voltage source 6, that is, to realize a disconnected sleep phase with a closed-circuit current very close to zero, and a preferably short awake phase with low power consumption.

The first resistors 5 are designed to be of high impedance in the form of tunnel magnetoresistive elements (TMR).

The evaluation unit 2 is connected to the power supply via a terminal VCC only when the ignition is switched on, and processes the Wheatstone bridge 1 signals in_n and in_p into position information 7 of the sensor. As usual, the position information 7 is transmitted analogously, digitally or by means of pulse width modulation (PWM) to an associated control unit.

Like the Wheatstone bridge 1, the switching signal unit 3 is permanently connected to the power supply via the terminal 30, and processes a change in the signals in_n and in_p into a switching command. As an alternative to the illustration in FIG. 1, the switching signal unit 3 may be spatially separated from the sensor and, for example, be arranged in a control unit.

Figure 2:
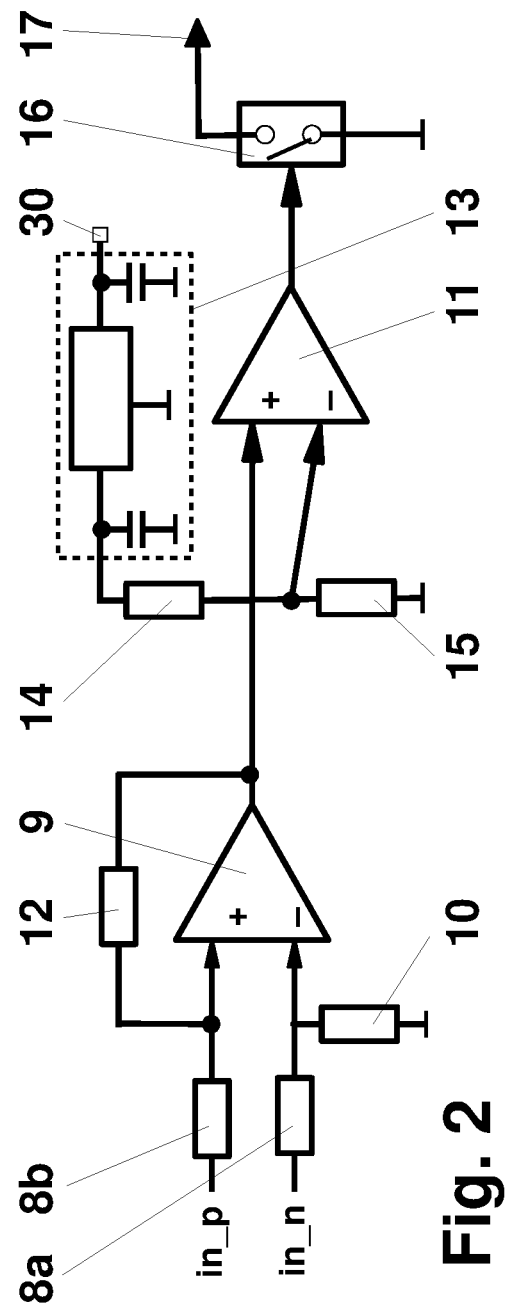
FIG. 2 is a circuit diagram of a switching signal unit.

A circuit diagram of the switching signal unit 3 is shown in FIG. 2. The signals in_n and in_p are fed into an operational amplifier 9 via a respective second resistor 8a, 8b. The signal in_n is connected via a third resistor 10 to an electrical ground between the associated second resistor 8a and a minus input of the operational amplifier 9. An output of the operational amplifier 9 is connected to a plus input of a comparator 11. The signal in_p is connected via a fourth resistor 12 to the output of the operational amplifier 9 between the associated second resistor 8b and a plus input of the operational amplifier 9. A minus input of the comparator 11 is connected via a voltage stabilizer 13 and a fifth resistor 14 to terminal 30, and via a sixth resistor 15 to ground, and is thus permanently supplied with power. A switch 16 is connected to an output of the comparator 11.

The voltage stabilizer 13 outputs a voltage of, for example, 3.3V or 5.0V.

The switch 16 is, e.g., a transistor, in particular a MOSFET.

The sensor function is as follows:

In normal operation, i.e., with the ignition switched on, both the Wheatstone bridge 1 and the switching signal unit 3 as well as the evaluation unit 2 are connected to voltage. As usual, the signals in_n and in_p of the Wheatstone bridge 1 are processed in the evaluation unit 2 into corresponding positions, and the position information 7 is relayed to a master control unit.

In idle mode, i.e., with the ignition off, only the Wheatstone bridge 1 and the switching signal unit 3 are connected to voltage via the terminal 30. The power consumption in this case is very low. Once a mechanism associated with the sensor is actuated, such as the clutch or brake pedal, the signals in_n and in_p that are output from the Wheatstone bridge 1, which are introduced into the switching signal unit 3, change. This change of the signals has the effect of closing the switch 16 in the switching signal unit 3 and outputting an activation command 17 to at least one predetermined control unit. A switching point for closing the switch 16 is set by the fifth resistor 14 and the sixth resistor 15.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor for a motor vehicle, the sensor comprising:
   an evaluation unit connected to a first output of the sensor, the evaluation unit connected to a control unit via a first connection; and
   a switching signal unit connected to a second output of the sensor in parallel with the evaluation unit, the switching signal unit connected to the control unit via a second connection.

2. The sensor according to claim 1, wherein the sensor comprises a Wheatstone bridge.

3. The sensor according to claim 2, wherein tunnel magnetoresistive elements are interconnected in the Wheatstone bridge.

4. The sensor according to claim 1, wherein the switching signal unit is permanently connected to voltage, and wherein the sensor is permanently connected to voltage.

5. The sensor according to claim 1, wherein the sensor is a position sensor.

6. The sensor according to claim 1, wherein the sensor is associated with a clutch or brake pedal, a steering angle sensor or a seat belt.

7. The sensor according to claim 1, wherein the switching signal unit is integrated in the control unit.

8. The sensor according to claim 1, wherein a switch of the switching signal unit includes a transistor.

9. The sensor according to claim 8, wherein the switch of the switching signal unit includes a MOSFET or a bipolar transistor.

10. The sensor according to claim 1, wherein the sensor has a clock-based sleep phase and a clock-based awake phase in an idle modes.

11. The sensor according to claim 1, wherein the switching signal unit activates the control unit and other sensors based on the second output signal.

12. The sensor according to claim 2, wherein only the Wheatstone bridge and the switching signal unit are permanently supplied with voltage.

13. The sensor according to claim 1, wherein the evaluation unit is connected to a power supply only when an ignition of the motor vehicle is switched on, the evaluation unit processing the first output of the sensor when connected to the power supply.

14. The sensor according to claim 1, wherein a change of signal from the sensor closes a switch of the switching signal unit, so that the switching signal unit outputs an activation command to the control unit.

15. A sensor unit, comprising:
- a sensor having a first signal output and a second signal output;
- an evaluation unit connected to the first output of the sensor, the evaluation unit connected to a control unit via a first connection; and
- a switching signal unit connected to the second output of the sensor, the switching signal unit connected to the control unit via a second connection,
- wherein the first signal output and the second signal output are supplied to the evaluation unit and the switching signal unit in parallel,
- wherein the first connection and the second connection to the control unit are in parallel, and
- wherein only the sensor and the switching signal unit are supplied with voltage in an idle mode, the evaluation unit being supplied with voltage in an normal mode with an ignition switched on.

16. The sensor unit according to claim 15, wherein the sensor has a clock-based sleep phase and a clock-based awake phase in the idle mode.

* * * * *